United States Patent
Mark et al.

(10) Patent No.: US 7,759,971 B2
(45) Date of Patent: Jul. 20, 2010

(54) SINGLE VIA STRUCTURED IC DEVICE

(75) Inventors: Shu Ern Perng Mark, Penang (MY); Yit Ping Kok, Permatang Pauh (MY); Soon Chieh Lim, Gelugor (MY); Jonathan Park, San Jose, CA (US); Herman Schmit, Palo Alto, CA (US)

(73) Assignee: eASIC Corporation, Santa Clara, CA (US)

( * ) Notice: Subject to any disclaimer, the term of this patent is extended or adjusted under 35 U.S.C. 154(b) by 355 days.

(21) Appl. No.: 11/766,575

(22) Filed: Jun. 21, 2007

(65) Prior Publication Data
US 2009/0109765 A1 Apr. 30, 2009

(51) Int. Cl.
*H01L 25/00* (2006.01)

(52) U.S. Cl. .............................. 326/41; 326/47; 326/101

(58) Field of Classification Search .............. 326/37–41, 326/47
See application file for complete search history.

(56) References Cited

U.S. PATENT DOCUMENTS

| | | | |
|---|---|---|---|
| 5,684,744 A | 11/1997 | Orgill et al. | |
| 6,194,912 B1 | 2/2001 | Or-Bach | |
| 6,236,229 B1 | 5/2001 | Or-Bach | |
| 6,245,634 B1 | 6/2001 | Or-Bach | |
| 6,331,733 B1 | 12/2001 | Or-Bach et al. | |
| 6,642,744 B2 | 11/2003 | Or-Bach et al. | |
| 6,953,956 B2 | 10/2005 | Or-Bach et al. | |
| 7,042,756 B2 | 5/2006 | Madurawe | |
| 7,098,691 B2 | 8/2006 | Or-Bach et al. | |
| 2002/0008540 A1* | 1/2002 | Britton et al. | 326/40 |
| 2006/0022705 A1* | 2/2006 | Or-Bach et al. | 326/41 |

* cited by examiner

*Primary Examiner*—Rexford N Barnie
*Assistant Examiner*—Jany Tran
(74) *Attorney, Agent, or Firm*—Connolly Bove Lodge & Hutz LLP

(57) ABSTRACT

A configurable logic array may include a multiplicity of logic components, which may contain customizable look-up tables, and layers of fixed metal segments all of which may be customizable using a single custom via layer. The integrated circuit containing the configurable logic array may also include a multiplicity of customizable register files, customizable RAM blocks; a ROM block with customizable contents; or test logic with customizable test options and configurations to separately test logic and the PLLs.

18 Claims, 18 Drawing Sheets

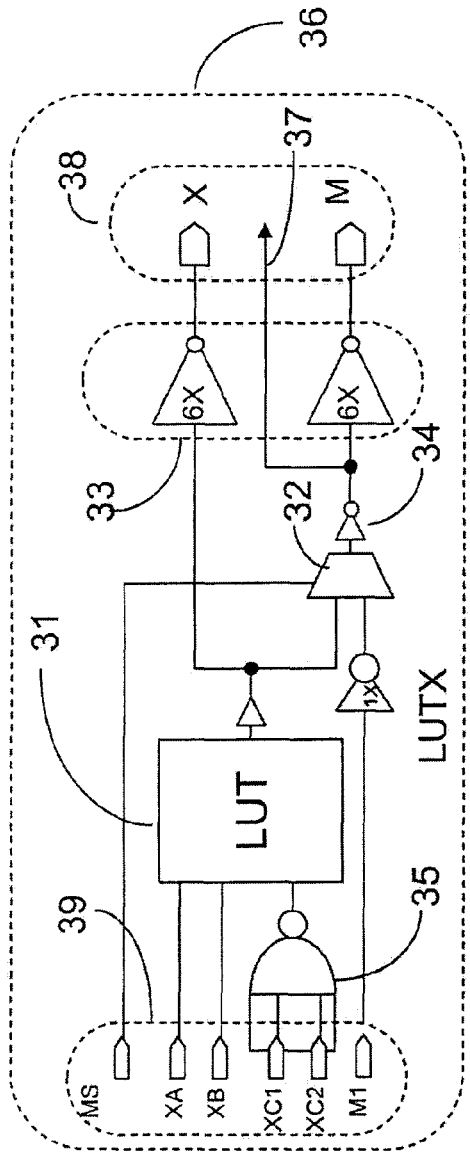
Figure 3a
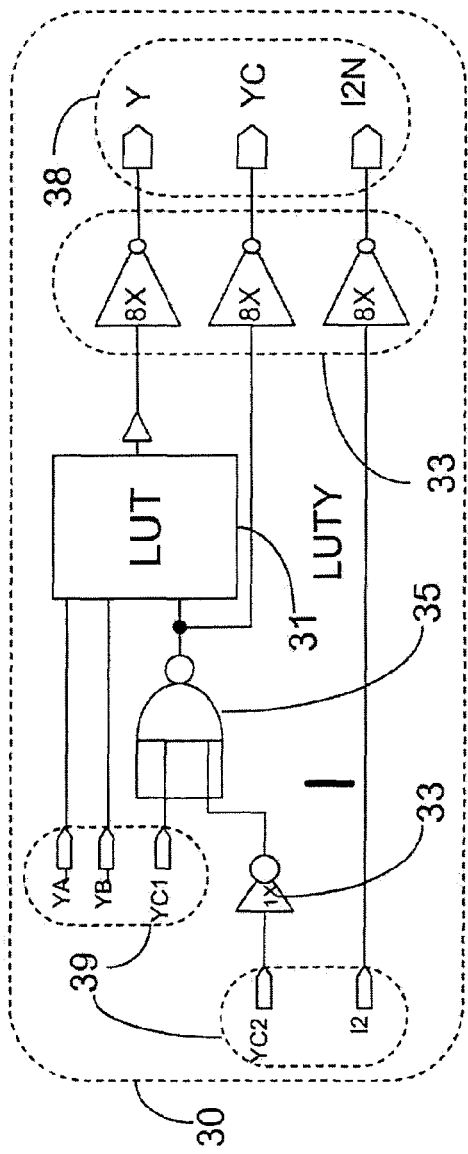
Figure 3b
FIGURE 3

SINGLE VIA STRUCTURED IC DEVICE

FIELD OF THE INVENTION

Various embodiments of the present invention may relate to integrated circuit devices as well as to methods for customizing and testing such devices.

BACKGROUND OF THE INVENTION

The following U.S. patents are believed to represent the current state of the art: U.S. Pat. Nos. 7,098,691, 6,953,956, 6,331,733, 6,245,634, 6,236,229, and 6,194,912. These patents all relate to prior art with respect to the current patent.

The above patents describe semiconductor devices, which contain logic cells that further contain electrically programmable look up tables and single via mask customizable interconnects. The advantages of such structured application-specific integrated circuits (structured ASICs) have been clearly defined in the prior art, but such devices require both customizing and programming to function properly, and while customizing interconnect (the term, "interconnect," may be used to refer to a single interconnection or multiple interconnections, depending on context) is a well-established procedure used to create application-specific integrated circuits (ASICs), it has previously been accomplished by generating a custom mask set for each ASIC's interconnect. Unfortunately, today's masks must reliably reproduce the deep submicron interconnect dimensions of current integrated circuit (IC) processes, which makes these masks very expensive. Alternatively, a method of customizing interconnect without a mask by using a computer controlled, scanning electron beam to pattern the single custom via layer on each chip may be used. Such a method may be no more expensive than photolithography because via area for the electron beam to scan is a very small portion of the chip area.

By comparison, field-programmable gate array (FPGA) devices are completely programmable at the customer's site. Most FPGAs contain programmable interconnect and programmable look-up tables (LUTs), which are very expensive due to the additional chip area required for the storage overhead necessary to program the interconnect.

The prior art also contains many examples of customizable flip-flops. U.S. Pat. Nos. 5,684,744 and 7,042,756 are representative of this prior art, and while these both describe functions that may be customized into different types of flip-flops, such customization is neither localized to a single wire segment nor allows for the bidirectional customization of that wire.

SUMMARY OF THE INVENTION

Embodiments of the present invention may help to provide an improved integrated circuit, which, in addition to the teachings of the prior art, may be customizable by a single via layer and may be testable.

Embodiments of the current invention may provide a set of components, which may include LUTs, flip-flops, RAM, ROM and/or other functions, along with a number of layers of interconnect (e.g., six) on a single semiconductor integrated circuit device, all of which may be customizable by placing selected vias on a single via layer, which may result in one or both of performance advantages and unit cost advantages over FPGAs and may also provide tooling cost advantages over traditional gate array and standard cell solutions by reducing the number of required masks (e.g., to one, or even to none, if electron beam technology is used). Furthermore, since no programming may be necessary, the additional per unit programming overhead, as described in the prior art and traditionally required for reconfigurable FPGAs, may also not be required.

One embodiment of the present invention may comprise a semiconductor device that may include an integrated circuit that may comprise an array of components, each having a multiplicity of inputs and a multiplicity of outputs, where at least one of the components is a customizable look-up table, at least one of the components is an inverter, at least one of the components is a multiplexer (MUX) function, and at least one of the components is a customizable flip-flop; and customizable interconnections to provide permanent direct interconnections among at least a plurality of the multiplicity of inputs and at least a plurality of the multiplicity of outputs, where the customizable interconnections may include at least six metal layers of fixed metal segments overlying the components, and where all of the customizable components and interconnections may be customized using a single via layer.

Furthermore the customization using a single via layer may be performed by direct wafer exposure by an electron beam machine, and at least one of multiple columns of components may contain a multiplicity of customizable look-up tables, inverters and MUX functions, and at least one of the columns of components may contain a different multiplicity of customizable flip-flops and inverters, where the customizable flip-flops may be selectively customizable to either a used state or an unused state, and a flip-flop customized to the unused state may be used for test purposes.

In addition, the customizable interconnect may include power and ground lines, and customization of the customizable components may include connecting various components to power and ground using the single via layer.

The single via layer may be disposed above half of the layers of interconnects and below half of the layers of interconnects; however, the invention is not thus limited. In fact, the numbers of layers of interconnects above and below the single via layer may be different.

At least one memory on the integrated circuit may contains at least one of a read port and a write port. The read port may include read address bits and read data bits. The write port may include write address bits and write data bits, and the number of read address bits, read data bits, write address bits and write data bits may be determined by customization of the memory, where the customization may be performed using a single via layer.

Furthermore the memory may be a RAM, a FIFO, or a ROM, which may be comprised of one or more customizable look up tables, where the customization of the look up tables may be performed using the single via layer.

The integrated circuit may also include a phase-lock loop (PLL) and test logic, where the test logic may bypass the PLL during user-selectable test modes that may, for example, include built-in self-testing (BIST), automated test pattern generated (ATPG) testing, and user-defined testing. The test logic may select and/or observe the PLL for PLL testing, and may select the PLL without observing it during normal operation. Furthermore, the PLL may be configured by either external user-defined parameters or customized parameters, where the customized parameters may be customized using the single via layer, and the customized parameters may be selected for the PLL during wafer and/or package testing of the IC.

The integrated circuit may contain at least one pass-gate, where the pass-gate may be controlled by a customizable connection to either a static voltage or to one of the customizable interconnects connected to one of the multiplicity of outputs, where the customizable connection may be formed by customization using the single via layer. The pass-gate may electrically connect one of the multiplicity of outputs to one of the customizable interconnects, or it may connect one of the components to one of the integrated circuit's static voltages.

At least one of the multiplicity of outputs on at least a first component may be directly connectable to at least one of a multiplicity of inputs on at least one component adjacent to the first component, and the direct connection may use a single customized via. A multiplicity of customizable LUTs may be directly connectable to form a Boolean function of greater than three inputs by customization of the LUTs.

BRIEF DESCRIPTION OF THE DRAWINGS

The present invention will be understood and appreciated more fully from the following detailed description, taken in conjunction with the drawings in which.

DETAILED DESCRIPTION OF VARIOUS EMBODIMENTS

In an exemplary embodiment of the current disclosure, an integrated circuit containing fixed columns of customizable logic functions and six layers of customizable interconnect segments may be customized by the proper placement of vias on a single via layer. It is noted, however, that this embodiment is not intended to be limiting. There may be other numbers of layers of customizable interconnects.

Figure 1:
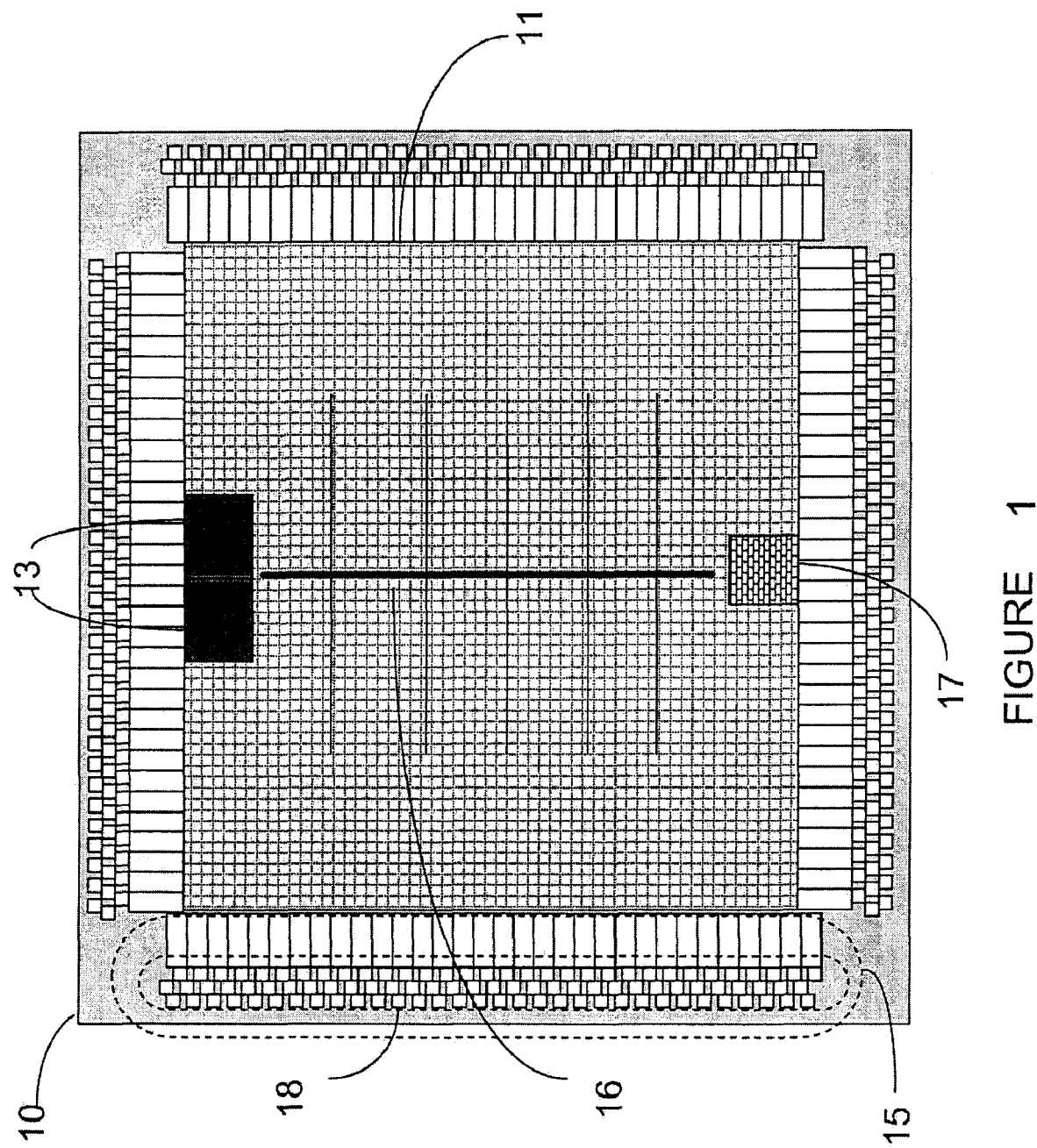
FIG. 1 is a simplified illustration of a customizable integrated circuit device constructed and operative in accordance with an exemplary embodiment of the present invention.

Reference is now made to FIG. 1, which is a simplified illustration of a customizable integrated circuit device constructed and operative in accordance with an embodiment of the present invention. The integrated circuit device 10 of FIG. 1 may include a logic array 11 that may be comprised of a multiplicity of look up tables (LUTs), logic components, flip-flops and register file logic with metal connection layers, clock phase lock loops 13, which may drive a configurable clock distribution structure 16, built-in test logic 17 and a multiplicity of configurable I/O cells 15, each with associated I/O pads 18. It is further contemplated that a varying number (including none) and/or size (including multiple sizes) of such devices may reside on many such semiconductor devices.

Figure 2:
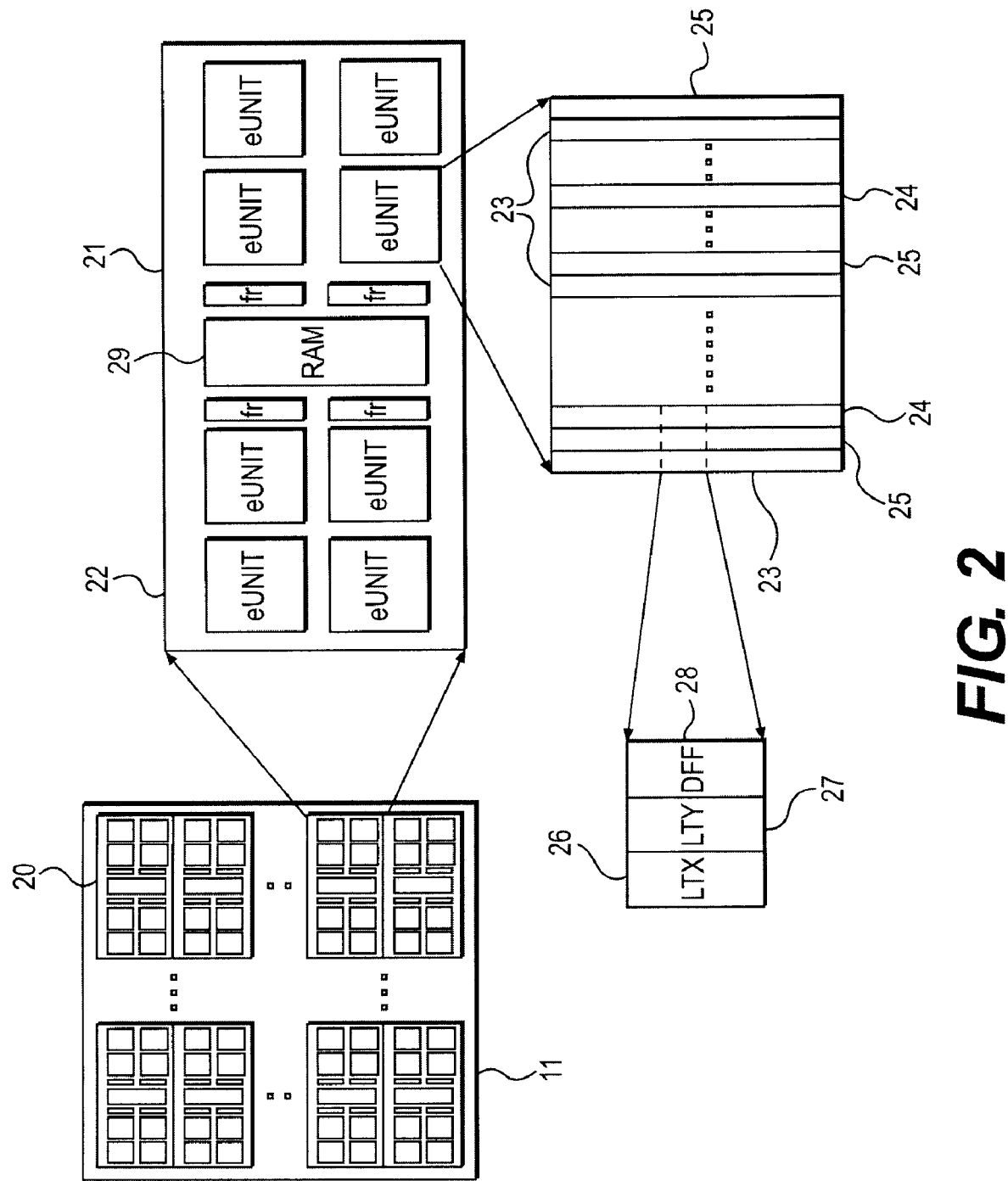
FIG. 2 is a detailed illustration of the hierarchy of a logic array, FIG. 3, consisting of FIGS. 3a and 3b, is a detailed illustration of the logic residing in exemplary LUTX and LUTY components.

Reference is now made to FIG. 2, which is a detailed illustration of an exemplary hierarchy of a logic array. The logic array 11 may include multiple eCores 20, which may be organized in rows and columns. Each eCore may contain four register files 21, and eight eUnits 22, and one RAM core 29. Each eUnit may contain a multiplicity of columns of multiple copies of a LUTX component 23, columns of multiple copies of a LUTY component 25, and columns of multiple copies of a DFF component 24. Each LUTX 26 and LUTY 27 may further include a customizable three-input look-up table and other components. Each DFF 28 may contain a scannable flip-flop with configurable data gating and multiple inverters. There may be any number of pairs of columns of LUTX components 23 and LUTY components 25 between each column of DFF components 24.

Reference is now made to FIG. 3, comprising FIGS. 3a and 3b, which shows detailed illustrations of the logic that may be found in LUTX and LUTY components. The LUTX 36 and LUTY 30 logic may each contain one customizable three-input LUT 31 and a number of other functions that may include a NAND gate 35 in front of one of each LUT's inputs, a number of inverters 33 and 34 of varying sizes, and a MUX 32 in the LUTX 36. Taken together, one copy of each of the exemplary LUTX and LUTY components has five outputs 38, eleven inputs 39, and one dedicated ROM logic output 37. Each has fixed wire segments that may be used to form connections between their logic functions 31-35 and between their logic functions 31-35 and their input/output (I/O) 38-39 (note that the term "I/O" may be used to refer to a single I/O component or to a collection of I/O components, depending on context). Furthermore, a possible construction of the MUX 32 may consist of two oppositely selectable pass-gates with separate source inputs and a common drain output, such as a pair of N-channel and P-channel transistors, which may drive a small inverter 34.

Figure 4:
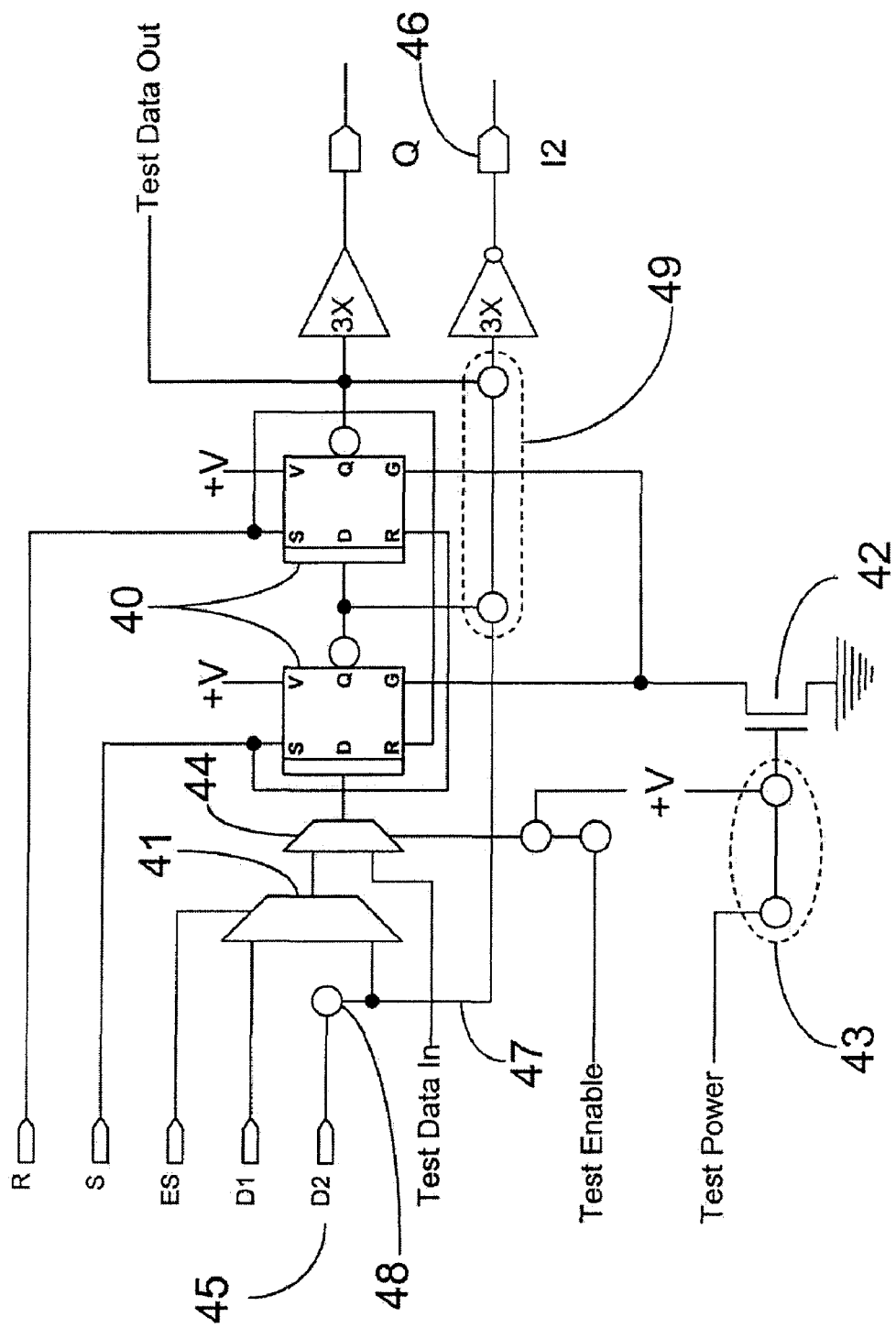
FIG. 4 is a detailed diagram of the logic that may reside in a DFF component.

Reference is now made to FIG. 4, a detailed diagram of exemplary logic that may be found in a DFF component. This logic may include two latches 40, each of which may have an inverting output, a data input, an asynchronous set input, an asynchronous reset input and power and ground connections, where the ground may be connected to a pass-gate, an N-channel transistor 42, which may be connected to +V if used or to a test power signal if not used, and this may be done by selecting one of two customizable vias 43. This may permit the ground connection to both latches to be disconnected when not used, which may thereby reduce the power consumption of the devices. A similar structure may be used to control a multiplexer 44, which may be used to select between a customizable feedback wire 47 and an external test input. These two structures may allow the unused flip-flops to be powered down during normal operation and powered up to be used for testing the IC.

Alternatively, the power or power and ground connections may be customized, or selection between multiple power connections, each with a different voltage level, may be customized as needed to meet the power and performance requirements of the user.

The DFF logic may also contain one inverter, one buffer, five inputs, two outputs, and a feedback wire 47, which may be configurable to feed back the output from either latch of the flip-flop into the multiplexers 44, 41 in front of the latches 40 by selecting one of the two customizable via locations 49. Alternatively, this same feedback wire 47 may be used to separately drive a signal in the forward direction, from an optional second data input 45 through an inverter to a one of the outputs 46. This signal may also propagate through the multiplexer 41, to be selected by a second multiplexer 44 for inputting into the latches 40 during normal operation. In this fashion, by properly configuring the connections to the single feedback wire segment 47, the DFF logic may be configured as a latch, a toggle latch, a flip-flop, or a flip-flop with data gated enable logic, using the feedback wire for feedback; or when using the feedback wire in the forward direction, the DFF logic may be configured as a flip-flop with an optional second multiplexed data input that may separately bypass the flip-flop.

Figure 5:
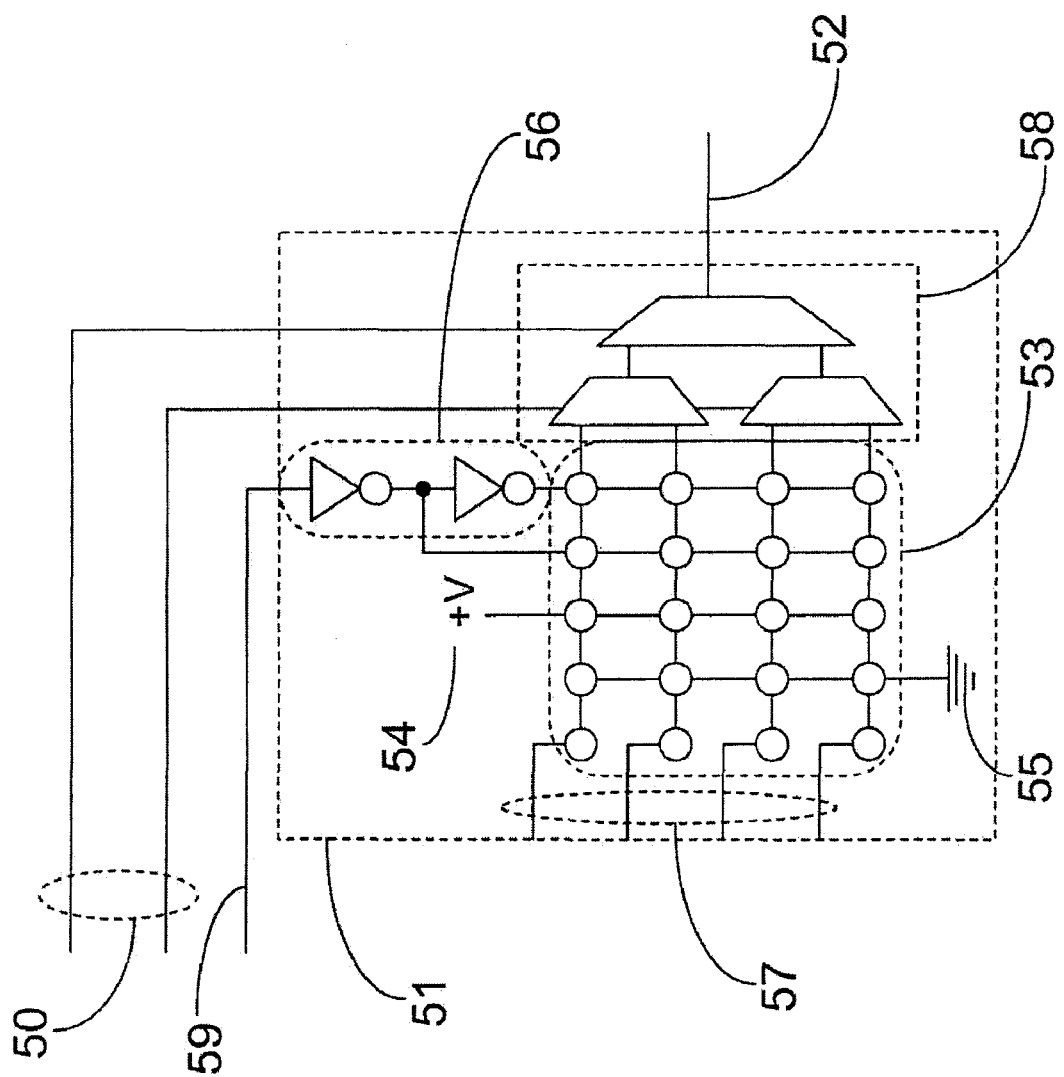
FIG. 5 is a detailed diagram of a three-input LUT function.

Reference is now made to FIG. 5, a detailed diagram of an exemplary three-input LUT function. The three-input LUT 51 with a single output 52 may include a four-way MUX function 58 that may contain two stages of two-way MUX functions with two inputs 50 selecting one row of a five by four array of customizable via locations 53, where the four data inputs of the four-way MUX function 58 may intersect five columns, of which one column may be connected to ground 53, one column may be connected to power 54, two columns may be connected to the third input 59 through one or both of two inverters 56, and one column may be connected to four external signals 57, each of which may intersect one of the four inputs of the four-way MUX function 58. Each via location may correspond to a point of intersection between a row and a column and when filled may thus connect the row to the intersecting column. In this fashion, any Boolean function of three inputs may be represented by connecting each row input of the four-way MUX function 58 to one of the rightmost four columns of the five-by-four array 53, and larger functions may be represented by using two of the inputs 50 to further select between two or more of the four external signals 57, by placing up to four vias in the leftmost column of the five-by-four array 53, connecting each of the external signals 57 to their respective row input of the four-way MUX function 58.

Unlike prior art, the LUT 51 may be entirely customizable by placing vias in four locations of the five-by-four array of customizable via locations 53.

Figure 18:
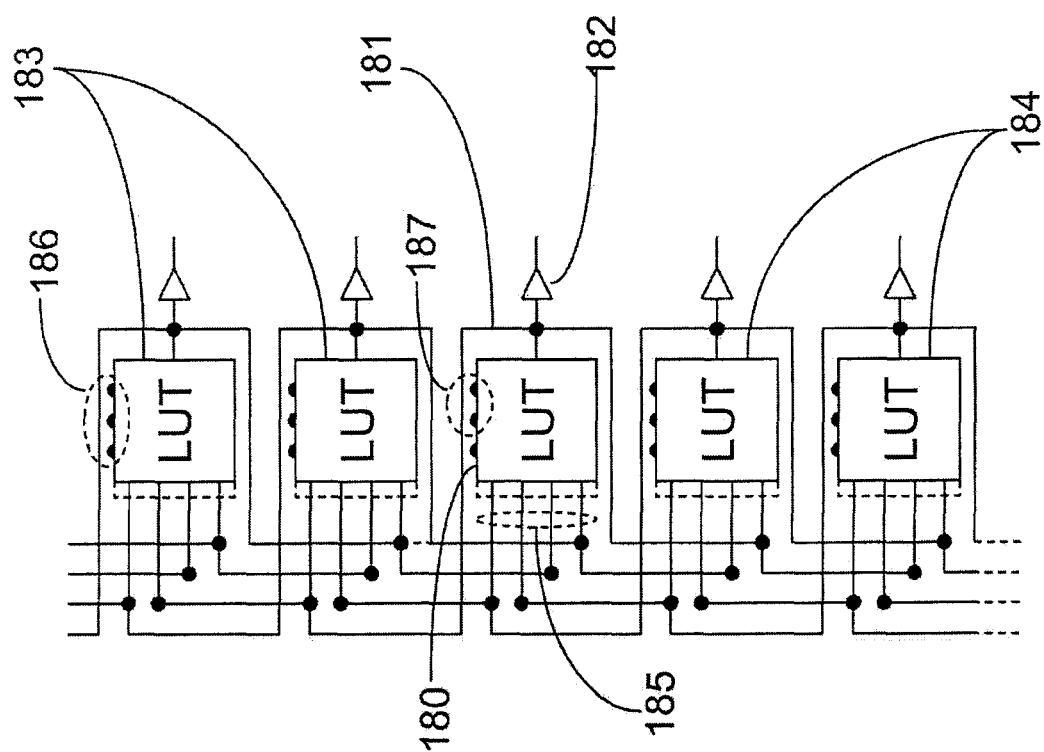
FIG. 18 is a diagram of an exemplary repeating pattern of external signal connections between LUTs in a column.

Reference is now made to FIG. 18, a diagram of the repeating pattern of external signal connections between LUTs in a column in an exemplary embodiment of the invention. Each customizable three-input look-up table 180 in both LUTX and LUTY logic may have an output that 181 that may be used to drive a buffer 182, the two LUTs above it 183 and the two LUTs below it 184, in a repeating pattern throughout the whole column. Conversely, each look-up table 180 may be driven by four external signals 185 coming from the outputs of the two LUTs above it 183 and below it 184, each of which may be connected to one of the four rows of the three-input look-up table, shown as signals 57 in FIG. 5. Externally, by connecting the three inputs 186 of the four LUTs 183 and 184 to the same three signals, connecting two of the three inputs 187 on the middle LUT 180, which are logically equivalent to the inputs 50 in FIG. 5, to two other signals, and properly customizing the five LUTs, any Boolean function of five inputs may be represented. Similarly, with each additional stage of LUT logic any Boolean function of two additional inputs may be represented. In other words any arbitrarily wide Boolean function may be represented by the appropriate combination(s) of customization of the LUTs in a column.

It is also contemplated that the repeating pattern of connections described above may be implemented in a row instead of a column. It is further contemplated that a similar repeating sequence may be implemented in two dimensions instead of one, where each adjacent LUT, above, below, to the left and to the right of a center LUT may drive the four external signal inputs of the center LUT. Alternatively the four diagonally adjacent LUTs, upper left, upper right, lower left and lower right, may also be connected in a similar fashion. It is also contemplated that the LUTs in the LUTX and LUTY logic may have the same or different physically repeating patterns of these connections.

Figure 12:
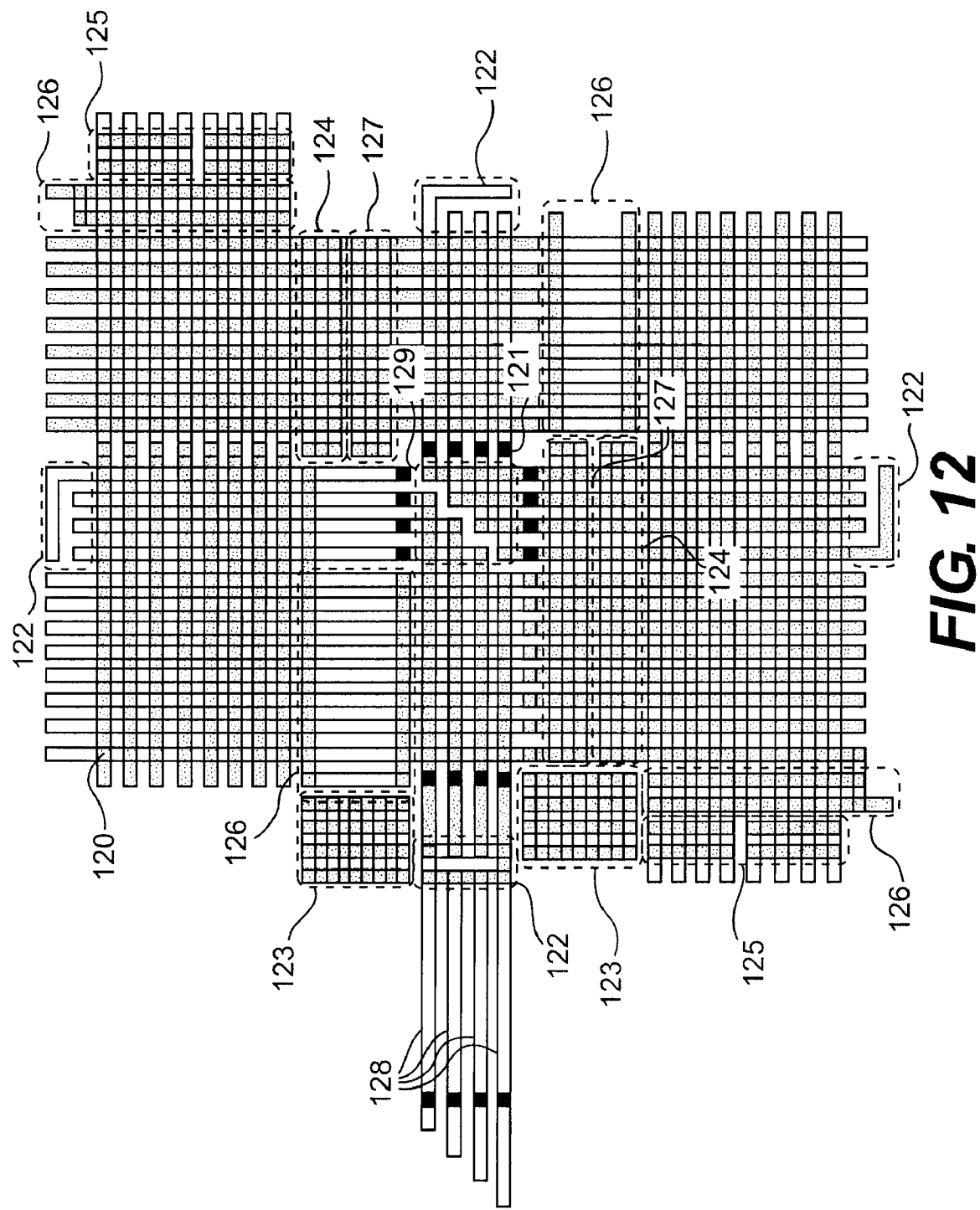
FIG. 12 is a diagram of fixed repeating wire segments on two wire layers with customizable via sites between them.

Reference is now made to FIG. 12, a diagram of exemplary fixed repeating wire segments on two wire layers with customizable via sites between them. The intersections between two segments residing on two layers such as 120 are the possible sites for vias to customize the fixed wire interconnect. The black via sites, such as 121, represent, in this figure, the sixteen I/O connections for the repeating portions of two of the three component types, a LUTX, a LUTY or a DFF, out of their respective adjacent columns, with the actual logic residing below this repeating structure. The vias 121 may be hardwired to the respective components of this logic as shown in FIGS. 3a, 3b and 4. The segments connected to the black via sites may overlap adjacent identical structures that are above, below and/or to either side in the regions 122, as seen by the additional segments 128 from the adjacent region to the left, so that direct connections between any of the I/Os on adjacent components may be constructed with a single customized via and without requiring any additional wiring segments. Furthermore, the via sites in the central region 129 may allow all but two of the sixteen I/Os to be connected to at least one other of the sixteen I/Os. In this manner, customized connections between the LUTX, LUTY or DFF components under each such repeating pattern of segments may be constructed. The two arrays of via sites between the rows and columns of fixed metal segments 123 may correspond to the five-by-four arrays of via sites that may be used to configure LUTs residing in the LUTX and LUTY logic as shown in FIG. 5, or to the configurable vias for the DFF logic as shown in FIG. 4. At least one wire dedicated to power and one wire dedicated to ground may intersect all the inputs 39 shown in FIGS. 3a and 3b and inputs 49 shown in FIG. 4, such that any input may be tied statically high or low.

In this manner a user-defined function may be placed on the integrated circuit by mapping the resulting functions and interconnect onto the fixed repeating array of LUT logic, flip-flops, and fixed repeating wire segments using only selected vias of a single custom via layer.

Figure 6:
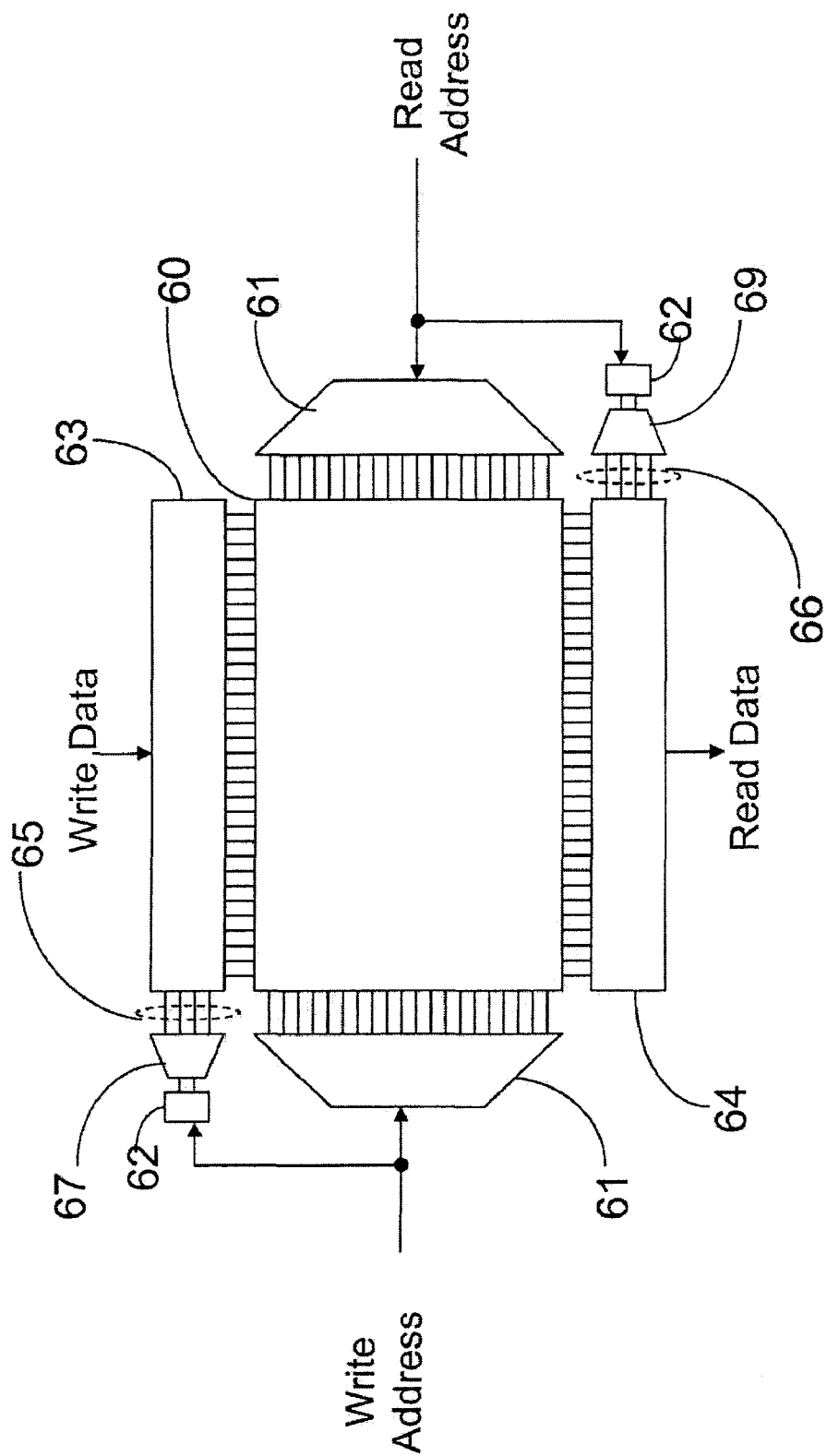
FIG. 6 is a high level diagram of a customizable register file.

Reference is now made to FIG. 6, a high-level diagram of an exemplary register file. Such a register file may include a core 60, two sets of address decode logic 61, two sets of configurable address logic 62 with decoders 67,69, configurable write data logic 63 and configurable read data logic 64, such that the register file may be customized into a wide variety of depths and widths. To accomplish this, N outputs 65 from the decoder 67 may be used to select among the N write data inputs, and N outputs 66 from the decoder 69 may be used to select among the N read data outputs.

Figure 7:
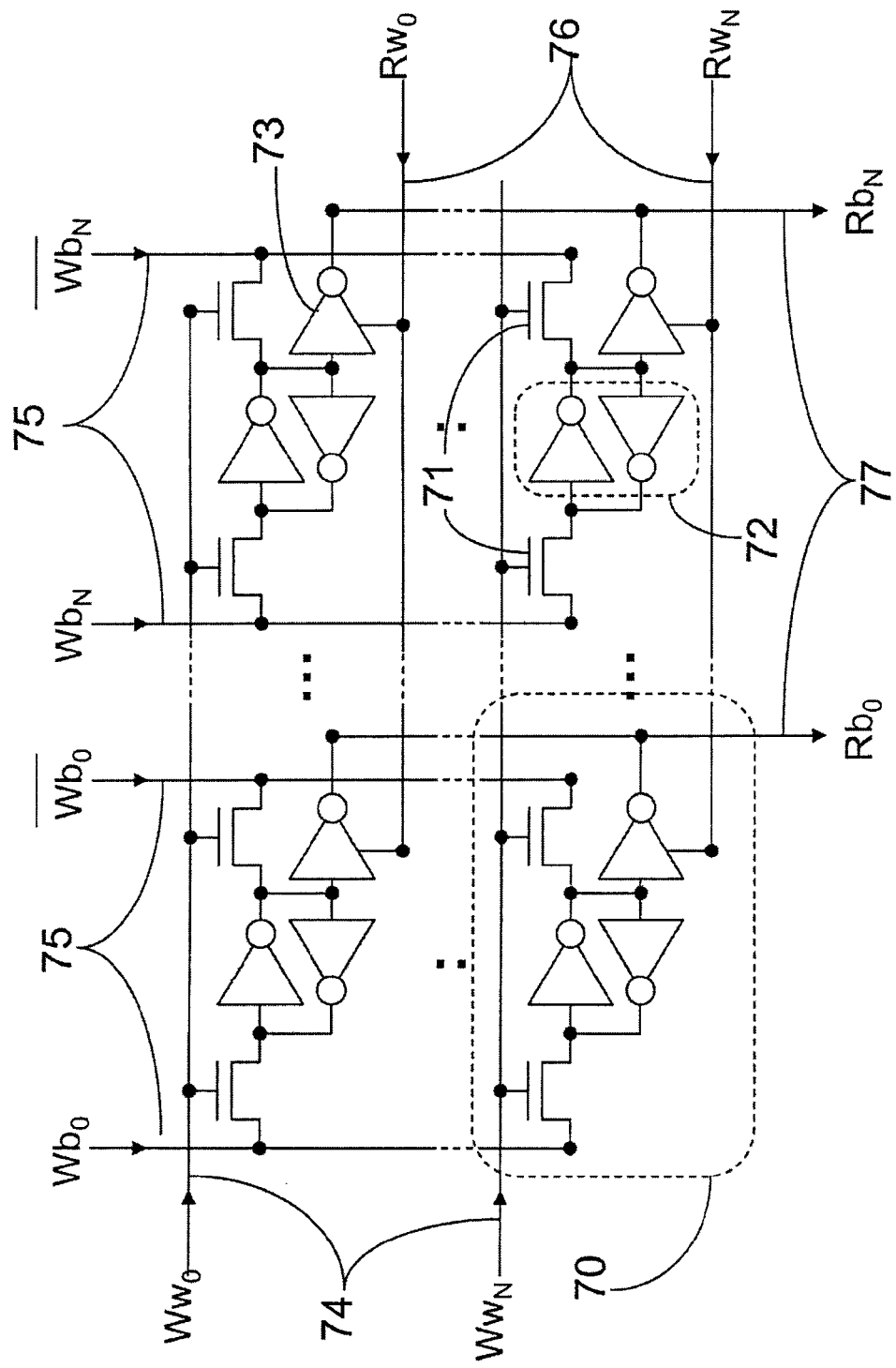
FIG. 7 is a detailed diagram of core of a register file.

Reference is now made to FIG. 7, a detailed diagram of an exemplary core of a register file. The core may include an array of memory cells 70, each of which may include two N-channel transistors 71, a pair of cross-coupled inverters 72 and a tri-state inverter 73. To write, one of the write word lines 74 from the decoder may be selected, turning on the N-channel transistors 71, which may then store the values on the write bit lines 75 into the cross-coupled inverters. To read, one of the read word lines 76 may be selected, enabling the tri-state inverters 73, which may then drive the memory values for the word onto the read bit lines 77.

Figure 8:
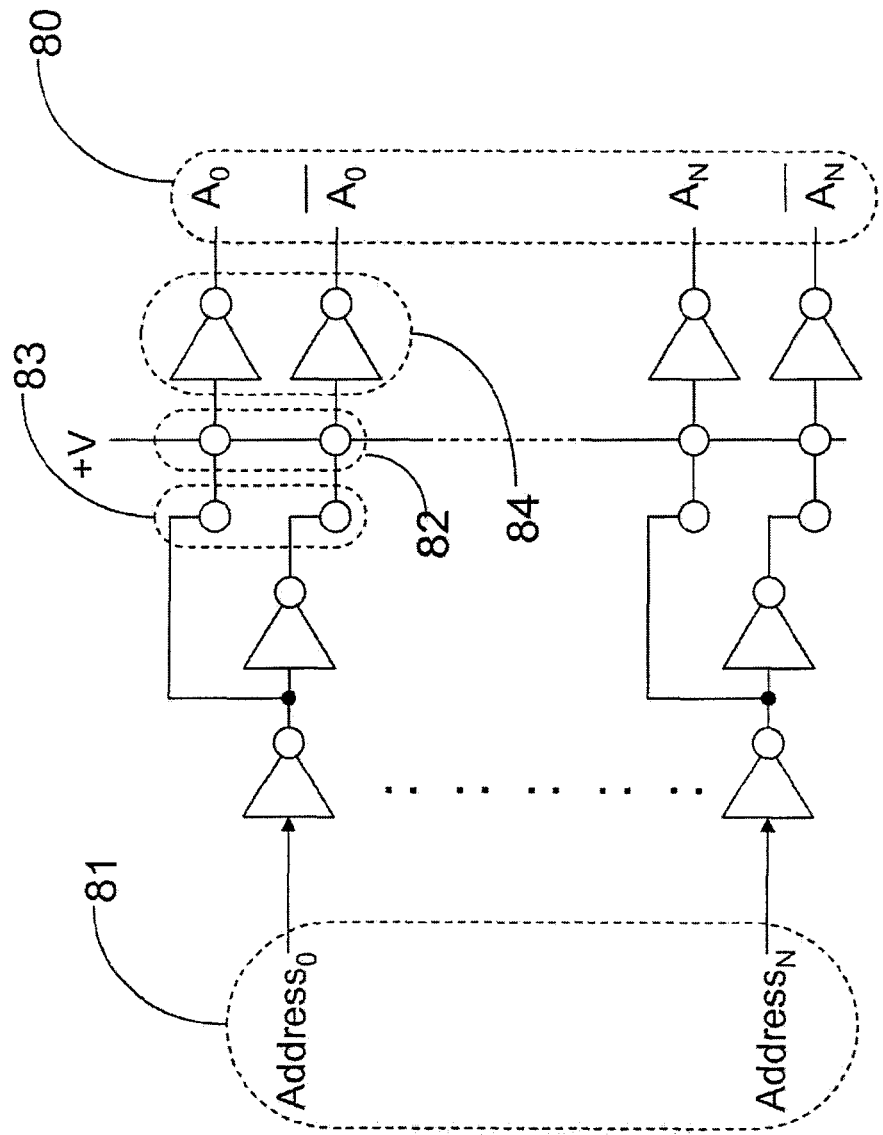
FIG. 8 is a detailed diagram of customizable address logic.

Reference is now made to FIG. 8, a detailed diagram of exemplary configurable address logic. Both polarities 80 of each address bit 81 may be sent to a decoder. Either polarity of each bit may be tied high by selecting the vias 82 to connect the last inverter's input to power and not selecting the vias 83, which would connect the buffered address input 81 to the last stage inverter 84.

Figure 9:
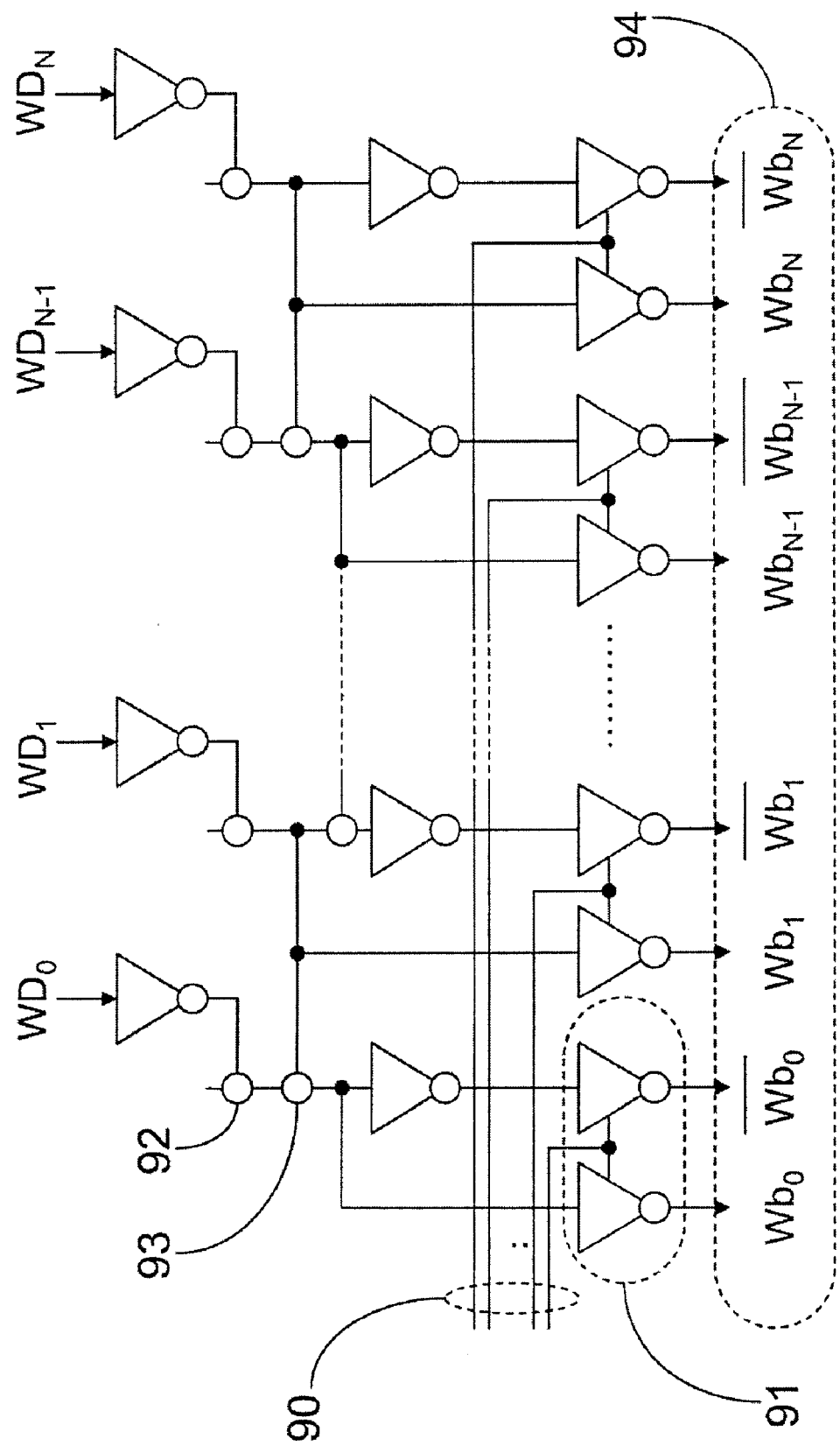
FIG. 9 is a detailed diagram of customizable write data logic, FIG. 10, a detailed diagram of customizable read data logic.

Reference is now made to FIG. 9, which shows a detailed diagram of exemplary configurable write data logic. Each of the N bits of write data may be selected by one of the N address signals 90 from the address decoder by driving two tri-state inverters 91 that may provide both polarities of the write data input onto the write bit lines. The customizable vias may be used to select between using this bit's write data input 92 and another bit's write data input 93. In this fashion, any variation between using none of the decoded address bits and connecting all the data inputs, to using all of the decoded address bits and connecting all the write bit lines 94 may be configured.

Figure 10:
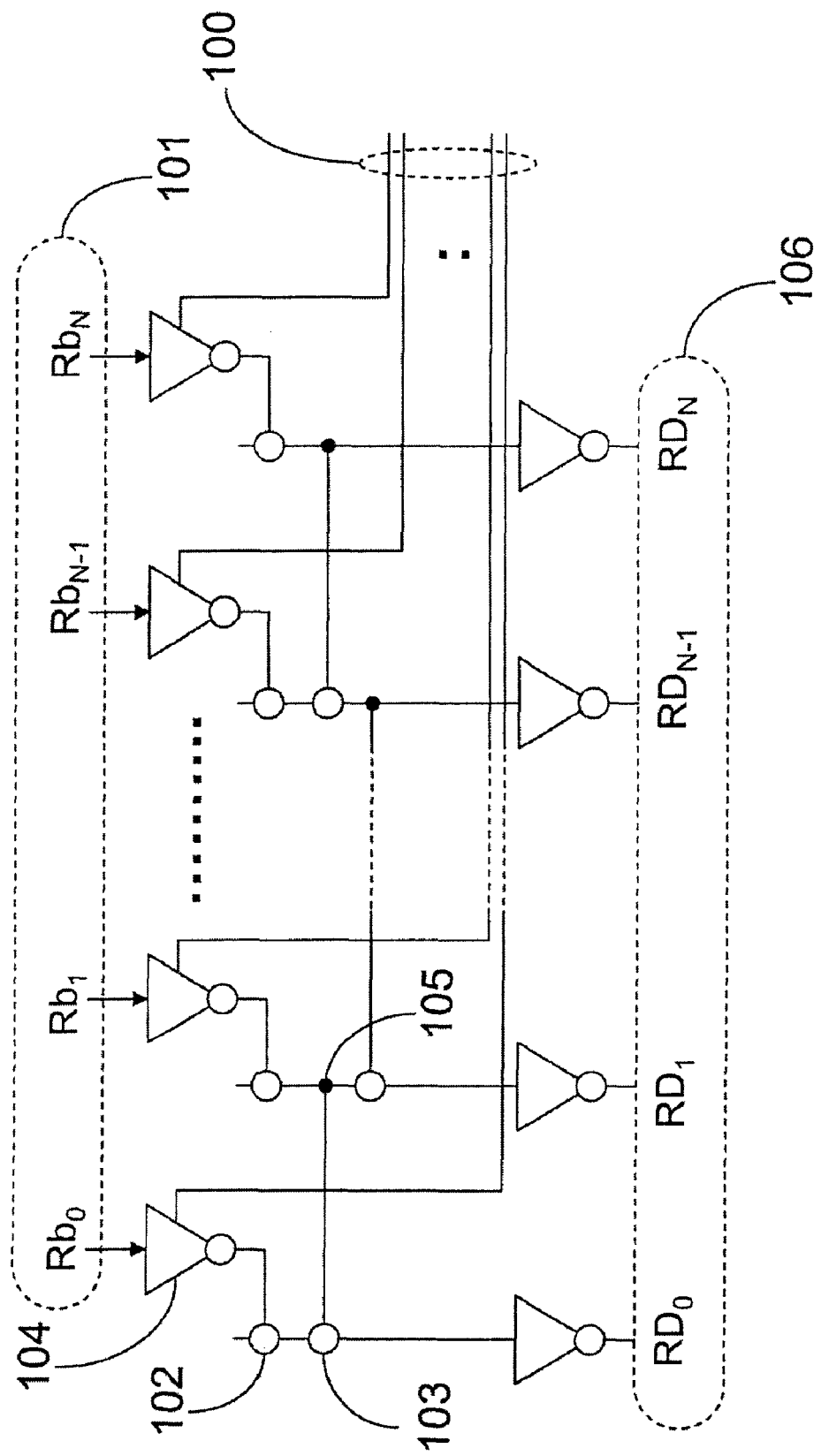

Reference is now made to FIG. 10, a detailed diagram of exemplary configurable read data logic. As with the configurable write data logic, there may be N decoded address signals 100, each of which may be used to select data from one of the read bit lines 101. The two customizable vias 102 and 103 respectively, may be used to select either the output of this bit's tri-state inverter 104 or another bit's signal 105 to drive out on this bit's read data output 106.

Consequently, in another embodiment of the present invention, a register file memory may be organized into a variety of depths and/or widths by customizing specific vias on a single via layer.

Figure 11:
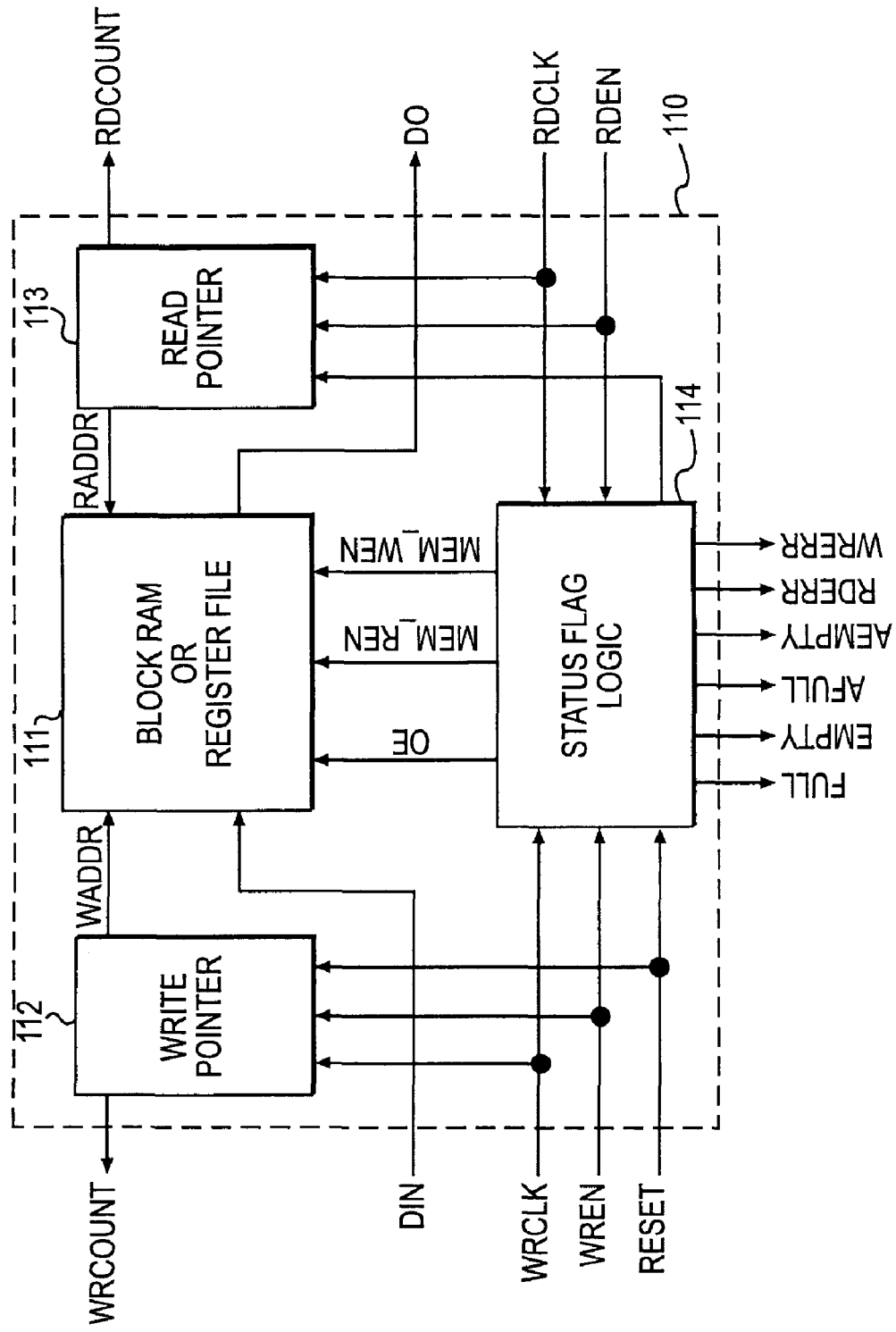
FIG. 11 is a high-level diagram of a first-in first-out (FIFO) memory.

Reference is now made to FIG. 11, a high-level diagram of a first-in first-out memory (FIFO). The configurable register file or RAM block 111 may include independent read and write operations, which, when external logic for generating the appropriate write address 112, read address 113 and controls 114 is added, can be transformed into a FIFO memory 110. The LUTs and wire interconnect in the logic array may be used to construct such external logic.

Reference is again made to FIG. 12, a diagram showing exemplary fixed repeating wire segments on two wire layers with customizable via sites between them. The two layers of fixed metal segments may interweave to provide all tracks access to metal layers above and below these two layers. The regions 124 and 127 may connect to the two fixed metal layers above these layers, and the regions 125 and 126 may connect to the two fixed metal layers below these layers. For the purposes of description, these six fixed metal layers will henceforth be labeled layer one at the bottom up to layer six at the top, though more layers of metal may exist for cell interconnect (e.g., but not necessarily, below these layers) and/or for local power, ground and/or I/O pad construction (e.g., but not necessarily, above these layers). By this nomenclature, the customizable via layer may reside, for example, between metal layers three and four; however, it is emphasized that this is merely an exemplary embodiment for purposes of discussion and that the customizable via layer may be located between other layers (for example, in another exemplary embodiment it may be located between layers four and five, instead of between layers three and four).

Figure 13:
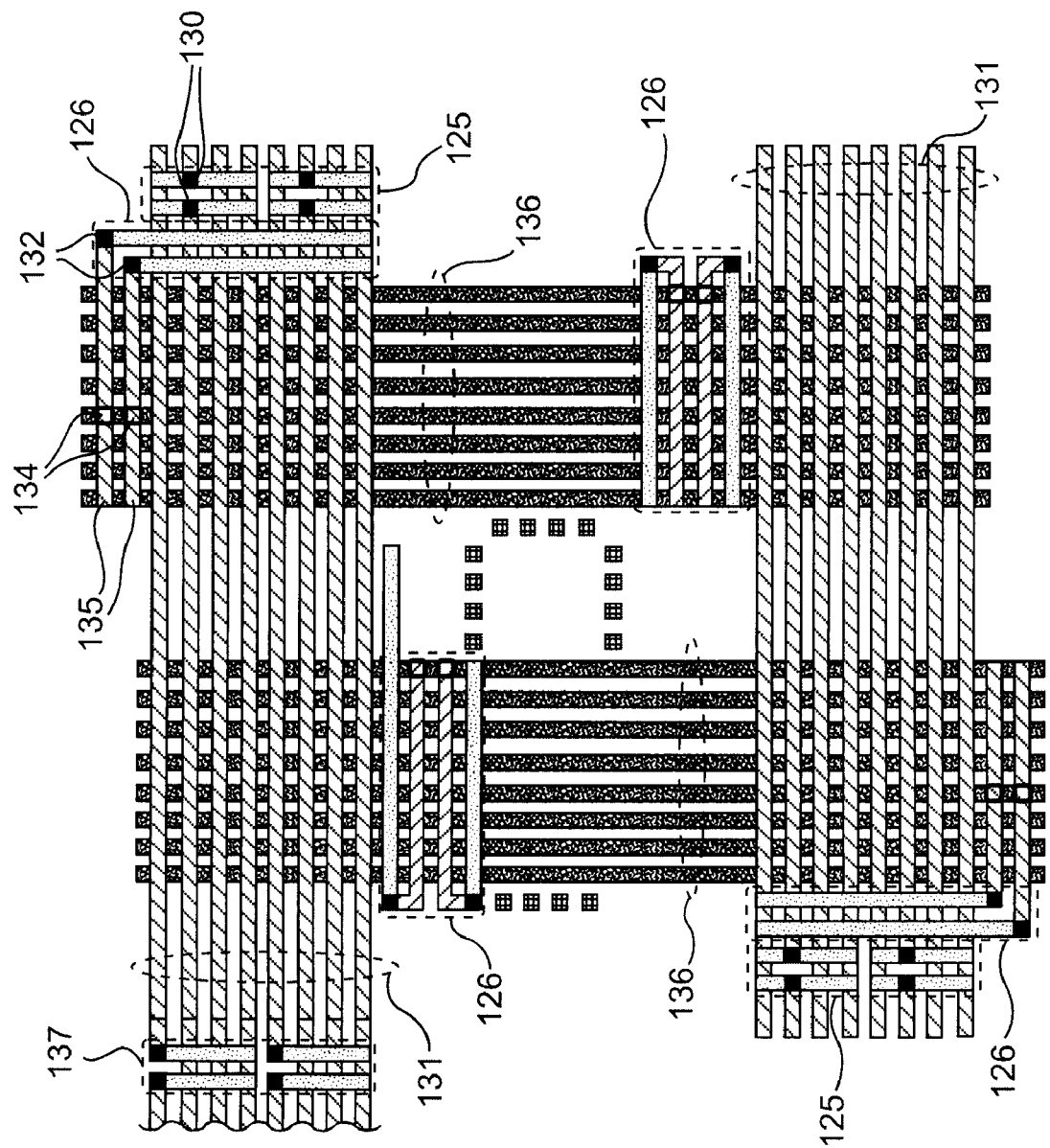
FIG. 13 is a diagram of fixed repeating wire segments on three wire layers below a customizable via layer.

Reference is now made to FIG. 13, which shows a diagram of exemplary fixed repeating wire segments on three wire layers that may lie below a customizable via layer. The regions 125 may consist of pairs of metal layer-three segments with fixed vias 130 connecting to horizontal fixed metal layer-two segments 131. Each of these horizontal segments may traverse three repeating regions, may be connected to vertical metal layer-three segments at their ends, and can be connected through these metal layer-three segments using customizable vias to any of four metal segments on metal layer four. The regions 126 may consist of pairs of metal layer-three segments with fixed vias 132 that may connect to fixed metal layer-two segments 135 that may traverse eight metal layer-one segments 136. Each of these metal layer-one segments may traverse vertically across three repeating regions and may be connected to metal layer-two segments at their ends with fixed vias 134. In this way, one of every four horizontal tracks on layer two and four vertical tracks on layer one may have segment end points per pair of LUT components in a repeating pattern.

Figure 14:
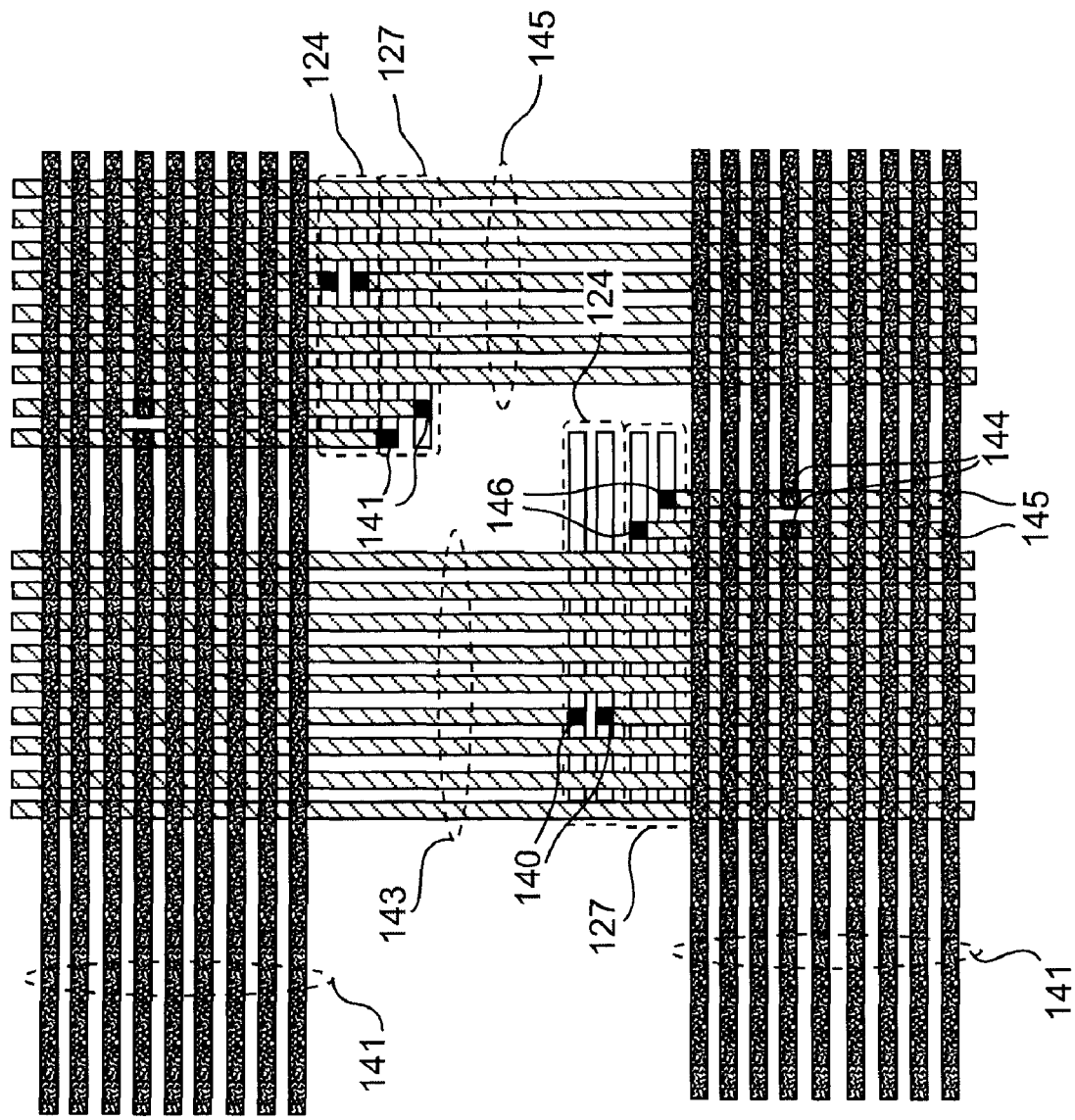
FIG. 14 is a diagram of fixed repeating wire segments on three wire layers above a customizable via layer.

Reference is now made to FIG. 14, a diagram showing an example of fixed repeating wire segments on three wire layers that may lie above the customizable via layer. The regions 124 may consist of pairs of metal layer-four segments with fixed vias 140 that may connect to vertical fixed metal layer-five segments 143. Each of these vertical segments may traverse nine repeating regions, may be connected to horizontal metal layer-four segments at their ends, and can be connected through these metal layer-four segments using customizable vias to any of eight metal segments on metal layer three, which may include four component I/Os. The group of vertical fixed metal layer-five segments 145 may comprise seven tracks and may thus repeat across seven repeating regions. The regions 127 may include pairs of metal layer-four segments with fixed vias 146 that may connect to fixed metal layer-five segments 147, which may traverse nine metal layer six segments 141. Each of these metal layer-one segments 141 may traverse horizontally across nine repeating regions and may be connected to metal layer-five segments at their ends with fixed vias 144. In this way, one of every nine horizontal tracks on layer six and seven or nine vertical tracks on layer five may have segment end points per pair of LUT components in a repeating pattern.

Thus, in another embodiment of the present invention, six layers of fixed metal segments of varying lengths and alternating directions may be customized by placing vias on a single via layer in the middle of the six layers of fixed metal segments. Furthermore, the components may be customized by placing vias on this same single via layer, including selectively connecting the components to power and ground if they are used, and not connecting them if they are not used, which may help save power.

As discussed above, the customizable via layer need not necessarily be located between layers three and four or in the middle of the various layers (of which there may be more or fewer than six). For example, in another exemplary embodiment of the invention, layer one may be used to interconnect transistors, and the interconnections discussed above may be implemented in, for example (but not limited to), six interconnect layers located on top of level one. In that case, the customizable via layer may be located between layers four and five, for example, if the arrangement were similar to above embodiments (or between any two appropriate layers; again, the invention is not to be limited to having the same number of interconnect layers above and below the customizable via layer or to having six interconnect layers).

Figure 15:
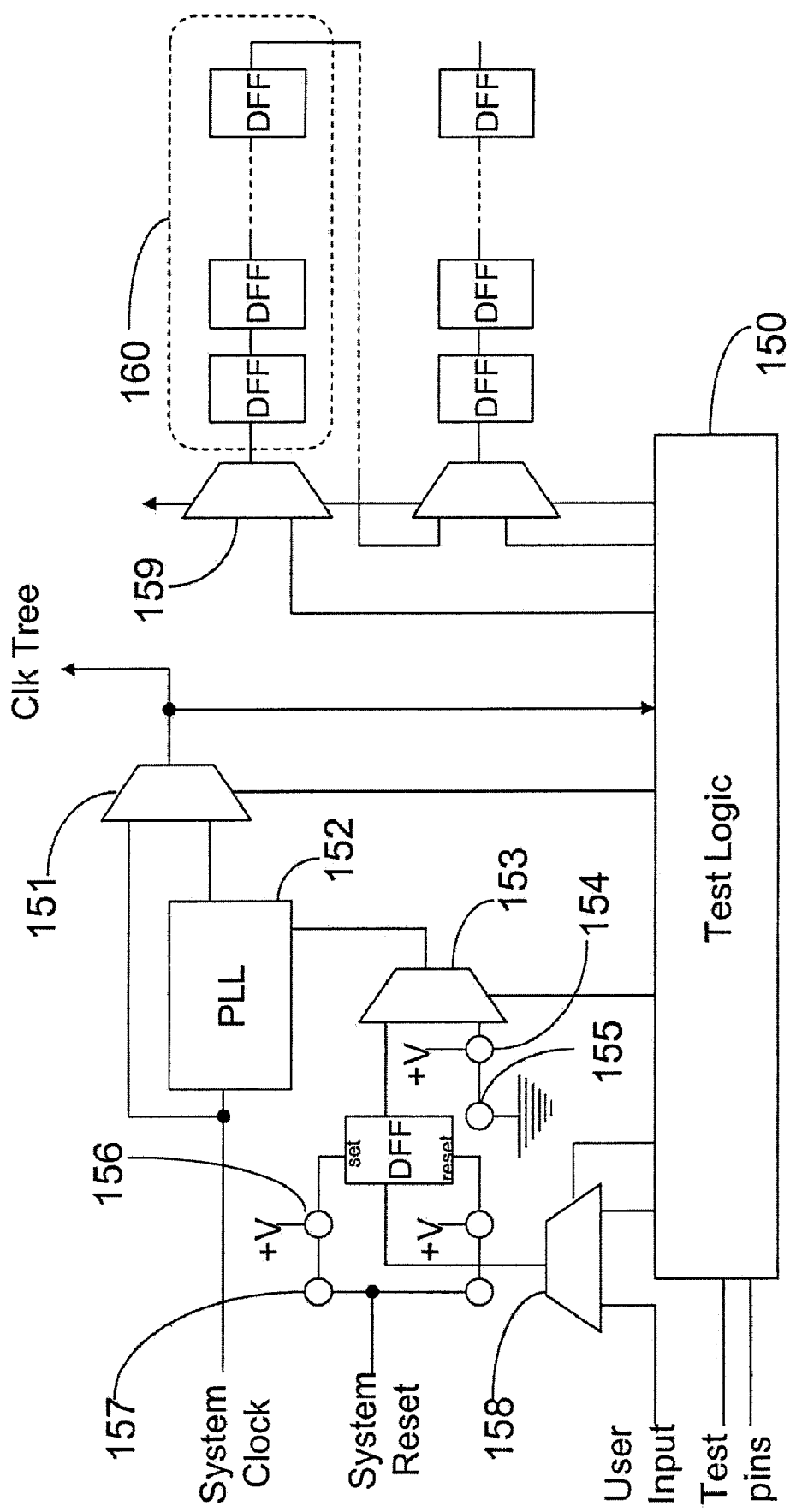
FIG. 15 is a diagram of exemplary customizable test logic for an integrated circuit.

Reference is now made to FIG. 15, a diagram of customizable test logic for an exemplary integrated circuit. The integrated circuit may contain dedicated test logic, which may be in addition to Joint Test Action Group (JTAG) features. Aspects of the test logic may be customizable by selection of vias that may be used to connect or pre-configure the operational and/or test functions of the integrated circuit. For example, the test logic 150 may be externally controlled by a set of test pins, which may provide for a number of different test modes, such as built-in self-testing (BIST), automated test pattern generated (ATPG) testing, phase-lock loop (PLL) testing, and/or other user-defined testing. As a result the test logic may control MUX functions 159, which may combine the strings of digital flip-flops (DFFs) 160 for user or BIST testing, or may separate them for ATPG testing. Similarly the test logic 150 may control a MUX 151, which may either drive the PLL clock onto the clock tree and observe it for PLL testing or may use the system clock, which may thus bypass the PLL 152, during ATPG and/or BIST test modes. The PLL 152 may be configured by input to the test logic 150 or by the user, depending on the test control to the MUX 158. Furthermore, the configuration may be set or reset either by the system reset or a hardwired configuration by the customization of selected via locations 156 and 157, respectively. In addition, a hardwired PLL configuration, which may be defined by tying off the MUX 153 input to a static voltage such as power or ground through the customization of selected vias 154 or 155, respectively, may be automatically loaded into the PLL 152 during power-up. It is further understood that such MUXes 153 and 158 may be constructed using a pair of oppositely selectable pass-gates. In this fashion, the PLL may be separately tested in one of a variety of standard configurations that patterns have been generated for, bypassing the PLL during functional testing to allow for proper isolation of BIST or ATPG failures, and still allowing the user to configure the PLL's normal operation to his/her specific requirements. Such customized hardwired PLL configurations may be selected during wafer and/or package testing to thoroughly test the PLL without having to manually generate a test procedure for the user's PLL configuration.

Customizable ROMs may be created by utilizing an array of LUT and MUX components, as shown in FIG. 3, from one or more columns 23 of an eUnit 22 as shown in FIG. 2, along with read address logic 61, 62, and 67 and read data logic 64, as shown in FIG. 6, from either the register files 21 shown in FIG. 2 or similar components available within each eCore 20 shown in FIG. 2.

Figure 16:
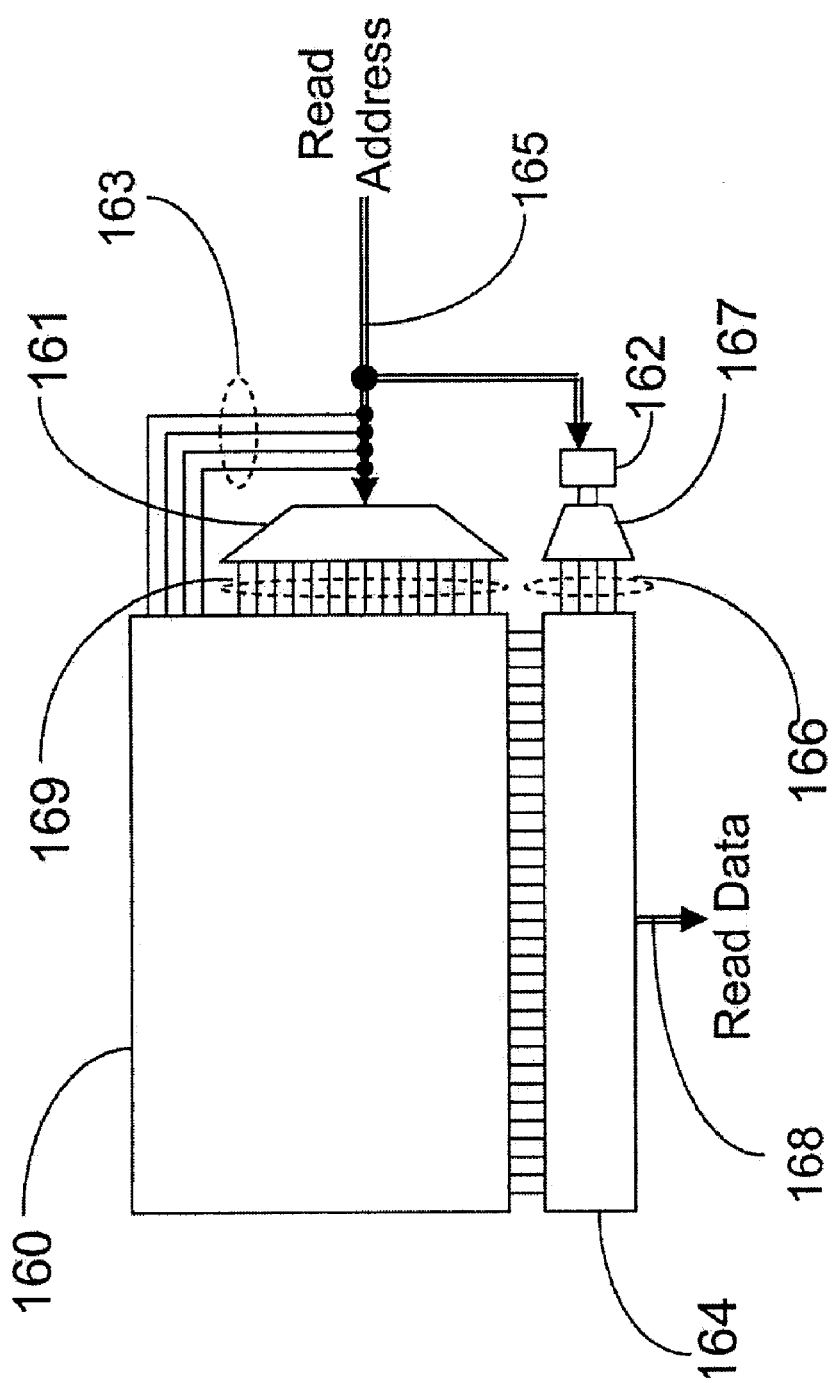
FIG. 16 is a high-level diagram of a customizable ROM.

Reference is now made to FIG. 16, a high-level diagram of a customizable ROM. The ROM may be composed of a core 160, an address decode 161, four address lines 163 from the read address 165, which may be decoded at the LUT and MUX logic in the core, and customizable read address logic 162, which may feed a decoder 167 that may select the read data 168 out of the customizable read data logic. The read address logic 162 and the read data logic 164 may be customized to configure the ROM into different widths and depths, as may be done with the register files.

Figure 17:
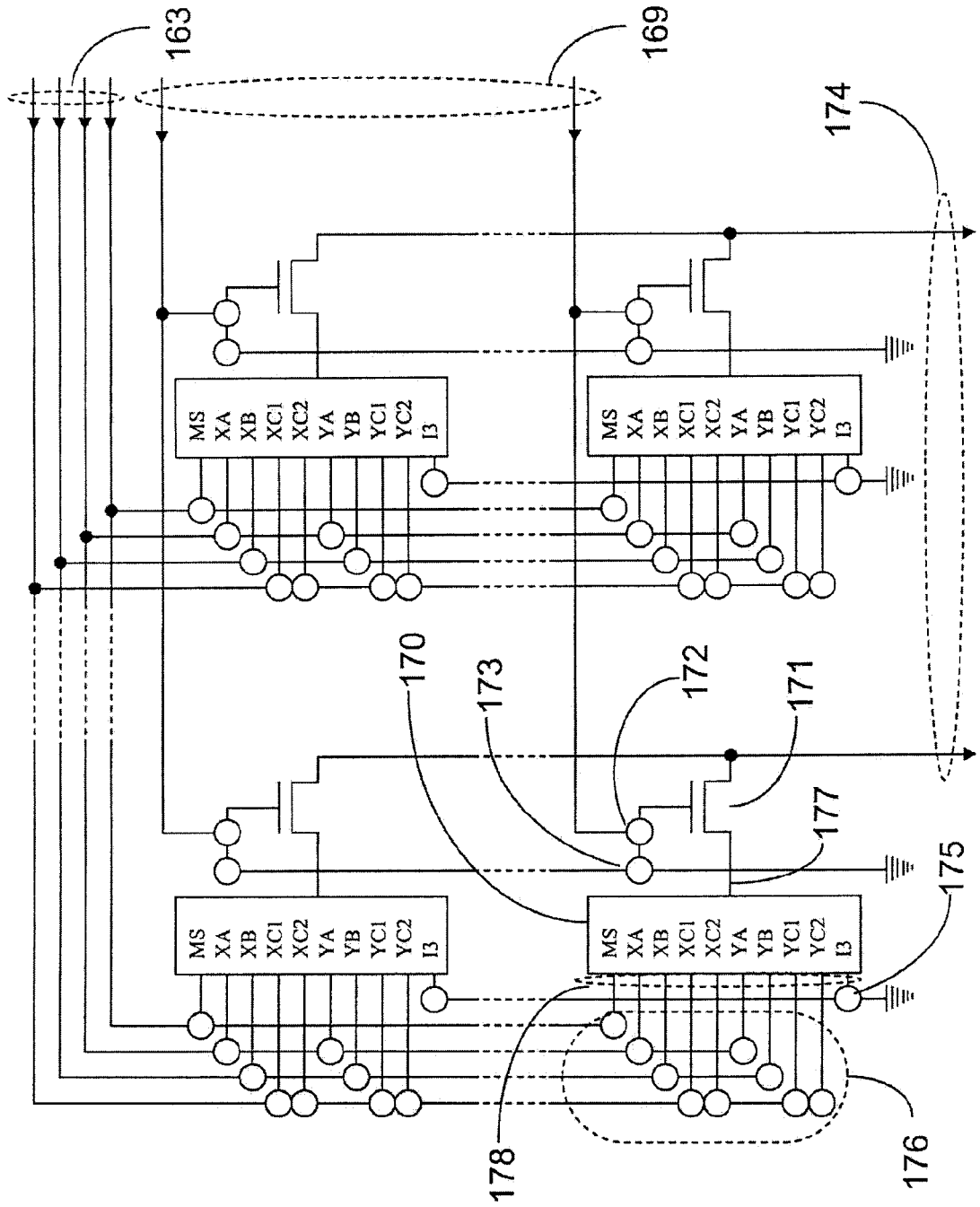
FIG. 17 is a diagram of a customizable ROM core, comprised of customizable LUT and MUX components.

Reference is now made to FIG. 17, a diagram showing an example of a ROM core. The core may be comprised of one or more columns of LUT and MUX components 170, four address lines 163, and one or more read data outputs 174. Each of the components, as seen in FIG. 3, may have two LUTs 30 and 31 and a MUX 32, which, when configured by selecting the appropriate customizable vias 36, may be configured into a 16-bit ROM cell. The ten inputs 39 and special output 37 can be seen in FIG. 16 as input connections 178 and an output 177 from the components 170. The inputs 178 may be connected to the read address lines 163 by selecting an appropriate set of customizable via locations 176 for nine of the inputs. A separate via 175 may connect the tenth unused input to ground. Each of the outputs 177 of components 170 used in the ROM may drive a pass-gate 171, in this case shown as, but not limited to, an N-channel transistor, whose gate may be tied to the decoded address line 169 for that row by selecting the appropriate via 172. The address lines 163 may select one of 16 bits in each component 170 to drive onto the output, and pass-gates 171 for the appropriate row, as selected by the decoded address lines 169, may, in turn, drive the output values onto the read data outputs 174. For the rows and columns that are not used in the ROM, the control input of the pass-gate 171 may be tied to ground by selecting a different via 173. In this fashion, any number of columns and rows of components within those columns may be used in one or more ROMs within the IC, while one may simultaneously use the rest of the unused components within unused columns and/or rows within the columns for other logic.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

We claim:

1. An integrated circuit comprising:
   components, each component having inputs and outputs, at least one component being a customizable component;
   a multiplicity of fixed interconnection layers to provide interconnections among components; and
   a single via layer to provide all customizable interconnections of the integrated circuit and to customize each customizable component of the integrated circuit, said single via layer to be disposed between two of said multiplicity of fixed interconnection layers,
   wherein said components include at least one customizable storage element, and wherein the at least one customizable storage element includes at least one wire segment, wherein a signal propagation direction on the at least one wire segment is a first direction in a first configuration of the at least one customizable storage element and is a second direction, opposite to the first direction, in a second configuration of the at least one customizable storage element.

2. The integrated circuit as in claim 1, wherein the at least one customizable storage element includes at least one customizable flip-flop.

3. The integrated circuit as in claim 1, wherein said components include at least one customizable storage element configured to be selectively customizable to a used state or an unused state and configured to be disconnected from a voltage supply if customized to an unused state.

4. The integrated circuit as in claim 1, wherein said customizable interconnections include connections to power and ground lines, and wherein customization of said customizable components includes connecting at least one of said components to power and ground using said single via layer.

5. The integrated circuit as in claim 1, wherein said components include at least one customizable look-up table to be customized by selecting one via location out of each of four rows within a four-row matrix of via locations.

6. The integrated circuit as in claim 1, further comprising:
a PLL; and
test logic;
  wherein said test logic is to bypass said PLL during at least one user-selectable test mode;
  to select and observe said PLL for PLL testing; and
  to select said PLL during normal operation.

7. The integrated circuit as in claim 6, wherein said PLL is to be configured by one or more parameters selected from the group consisting of external user defined parameters and customized parameters;
  wherein said customized parameters are to be customized using said single via layer.

8. The integrated circuit as in claim 7, wherein said customized parameters are to be selected for said PLL during wafer and package testing of the integrated circuit.

9. The integrated circuit as in claim 1, further including at least one pass-gate, wherein said pass-gate is to be controlled by a customizable connection to a static voltage or to one of said customizable interconnects connected to one of said outputs;
  wherein said customizable connection is to be formed by customization using said single via layer.

10. The integrated circuit as in claim 9, wherein said static voltage is a voltage selected from the group consisting of power and ground voltages.

11. The integrated circuit as in claim 9, wherein said pass-gate is connected to an output of a customizable component and to a common interconnect, to electrically connect said one output to said common interconnect.

12. The integrated circuit as in claim 11, wherein said output is the output of an inverter.

13. The integrated circuit as in claim 9, wherein said pass-gate is to electrically connect one of said components to power or ground by customization using said single via layer.

14. The integrated circuit as in claim 1, wherein at least one of the components contains at least one pass-gate, said pass-gate to be controlled by at least one customized connection selected from the group consisting of a connection to power, a connection to ground, and a connection to a customizable interconnection,
  wherein said pass-gate is to selectively electrically connect the power, ground or customizable interconnection to one of said inputs,
  wherein said customized connection consists of at least one via of said single via layer.

15. The integrated circuit as in claim 1, wherein an output of at least a first one of said components is directly connectable to at least one input of at least one of said components adjacent to said first said component, said direct connection to be formed using a single customized via.

16. The integrated circuit as in claim 1, wherein said components include a multiplicity of customizable look-up tables, and wherein said multiplicity of customizable look-up tables are directly connectable to form a Boolean function of greater than three inputs by customization of said look-up tables.

17. The integrated circuit as in claim 1, wherein customization of the single via layer is performed directly on a wafer containing the integrated circuit by computer controlled electron beam lithography.

18. The integrated circuit as in claim 1, wherein one or more columns of components include one or more customizable look-up tables and multiplexers, wherein at least said one or more customizable look-up tables are to be customized using said single via layer, one or more of said customizable look-up tables and multiplexers to be interconnected to form a read-only memory.

* * * * *